US009065440B2

(12) United States Patent
Chromczak

(10) Patent No.: US 9,065,440 B2
(45) Date of Patent: Jun. 23, 2015

(54) BYPASSABLE CLOCKED STORAGE CIRCUITRY FOR DYNAMIC VOLTAGE-FREQUENCY SCALING

(71) Applicant: Altera Corporation, San Jose, CA (US)

(72) Inventor: Jeffrey Christopher Chromczak, Brownsville (CA)

(73) Assignee: Altera Corporation, San Jose, CA (US)

( * ) Notice: Subject to any disclaimer, the term of this patent is extended or adjusted under 35 U.S.C. 154(b) by 236 days.

(21) Appl. No.: 13/754,579

(22) Filed: Jan. 30, 2013

(65) Prior Publication Data

US 2014/0210510 A1    Jul. 31, 2014

(51) Int. Cl.
*G06F 1/10* (2006.01)
*H03K 19/177* (2006.01)
*H03K 19/0175* (2006.01)
*H03K 19/00* (2006.01)

(52) U.S. Cl.
CPC ............ *H03K 19/0175* (2013.01); *H03K 19/00* (2013.01); *G06F 1/10* (2013.01); *H03K 19/17792* (2013.01)

(58) Field of Classification Search
USPC ...................... 326/33, 80, 81, 40, 46; 327/333
See application file for complete search history.

(56) References Cited

U.S. PATENT DOCUMENTS

| | | | |
|---|---|---|---|
| 7,155,617 B2 | 12/2006 | Gary et al. | |
| 7,346,861 B1 * | 3/2008 | Lee .............................. | 716/103 |
| 8,207,764 B2 | 6/2012 | Dubost et al. | |
| 8,278,980 B1 | 10/2012 | Dubost et al. | |
| 8,314,632 B1 * | 11/2012 | Liu .................................. | 326/21 |
| 8,710,889 B1 * | 4/2014 | Chromczak .................. | 327/261 |
| 2009/0243687 A1 | 10/2009 | Lewis et al. | |

FOREIGN PATENT DOCUMENTS

| | | |
|---|---|---|
| JP | 20082337397 | 9/2008 |
| JP | 2010192590 | 9/2010 |

* cited by examiner

*Primary Examiner* — Daniel D Chang
(74) *Attorney, Agent, or Firm* — Treyz Law Group; Jason Tsai

(57) ABSTRACT

Integrated circuits with sequential logic circuitry are provided. Sequential logic circuitry may include a chain of bypassable clocked storage elements coupled between a speed critical input terminal and a speed critical output terminal. Combinational logic circuits may be interposed between each adjacent pair of bypassable clocked storage elements in the chain. Dynamic voltage-frequency scaling (DVFS) control circuitry may provide an adjustable power supply voltage to the combinational logic circuits and may provide an adjustable clock signal to control the clocked storage elements. The DVFS control circuitry may be used to selectively enable at least some of the bypassable clocked storage elements while disabling other bypassable clocked storage elements so that the power supply voltage can be reduced while maintaining the same operating frequency. The power supply voltage and the frequency of the clock signal can be adjusted to provide the desired voltage-frequency tradeoff.

20 Claims, 15 Drawing Sheets

BYPASSABLE CLOCKED STORAGE CIRCUITRY FOR DYNAMIC VOLTAGE-FREQUENCY SCALING

BACKGROUND

There is an increasing demand for digital integrated circuits to operate at higher speeds while minimizing power consumption. To achieve the desired balance between power consumption and performance across a wide variety of applications and operation conditions, digital integrated circuits are sometimes provided with dynamic voltage-frequency scaling (DVFS) capabilities.

In a conventional dynamic voltage-frequency scaling scheme, an integrated circuit is able to operate at different voltage-frequency points. When higher performance is needed, the voltage can be increased to reduce gate delays and to allow for an increase in clocking frequency. When low power consumption is desired, the clocking frequency is decreased to allow for a reduction in voltage. The integrated circuit may be placed in these different voltage-frequency states depending on changes in current incoming workload or operation conditions.

Conventional DVFS schemes allow integrated circuits to operate at discrete voltage-frequency points or over a continuous voltage-frequency range. The relationship between the voltage and frequency is, however, fixed at design time and is determined by the particular circuit structure. For example, consider a scenario in which an integrated circuit includes combinational logic that is interposed between two flip-flop circuits, where the combinational logic exhibits a propagation delay of four nanoseconds when the combinational logic is powered using a supply voltage of 1.0 V. In this example, the maximum operating frequency at which the flip-flop circuits could be operated is limited to 250 MHz. In other words, the maximum operating frequency at a given voltage is determined entirely by the circuit structure of the combinational logic and, more particularly, by the delay associated with the combinational logic, neither of which can be adjusted after fabrication.

SUMMARY

This relates generally to integrated circuits and, more particularly, to integrated circuits with dynamic voltage-frequency scaling capabilities. An integrated circuit (e.g., a programmable integrated circuit that is provided with configuration data) may be provided with logic circuitry interposed in a data path. The logic circuitry may include sequential logic circuits such as bypassable clocked storage elements (sometimes referred to as bypassable registers) and combinational logic circuits such as logic delay elements (e.g., logic gates, programmable interconnects, etc.). Logic delay elements may be coupled between each adjacent pair of bypassable registers in the data path.

The integrated circuit may be operated in various voltage-frequency states. In a first state, control circuitry may be used to provide a first power supply voltage to the logic circuitry while the logic circuitry is operating at a given frequency. In a second state, the control circuitry may be used to provide a second power supply voltage to the logic circuitry while the logic circuitry is operating at the given frequency. A first number of the bypassable registers may be switched into use during the first state, whereas a second number of bypassable registers may be switched into use during the second state.

In other words, voltage scaling may be performed at a fixed operating frequency by selectively enabling an appropriate number of the bypassable registers in the data path. The control circuitry may dynamically switch from the first state to the second state without reconfiguring the integrated circuit with a new set of configuration data, and vice versa. In general, the control circuitry may be used to implement dynamic voltage-frequency scaling capabilities by providing an adjustable power supply voltage to the combinational logic circuits and an adjustable-frequency clock signal to the sequential logic circuits.

If desired, the integrated circuit may support multithreading operations to handle logic circuitry with feedback loops. In particular, the logic circuitry having feedback loops may also be provided with bypassable registers. Different numbers of bypassable registers may be enabled during different multithreading modes to handle input signals from a corresponding number of threads. In general, switching into use more bypassable registers can serve to enable lower voltage operation at the cost of latency (e.g., voltage scaling may be performed at a fixed frequency for feedback circuits via multithreading techniques).

Further features of the present invention, its nature and various advantages will be more apparent from the accompanying drawings and the following detailed description.

DETAILED DESCRIPTION

Embodiments of the present invention relate to integrated circuits with logic circuitry. The integrated circuits may be any suitable type of integrated circuit, such as microprocessors, application-specific integrated circuits, digital signal processors, memory circuits, or other integrated circuits. If desired, the integrated circuits may be programmable integrated circuits that contain programmable logic circuitry. The present invention will generally be described in the context of integrated circuits such as programmable logic device (PLD) integrated circuits as an example.

Figure 1:
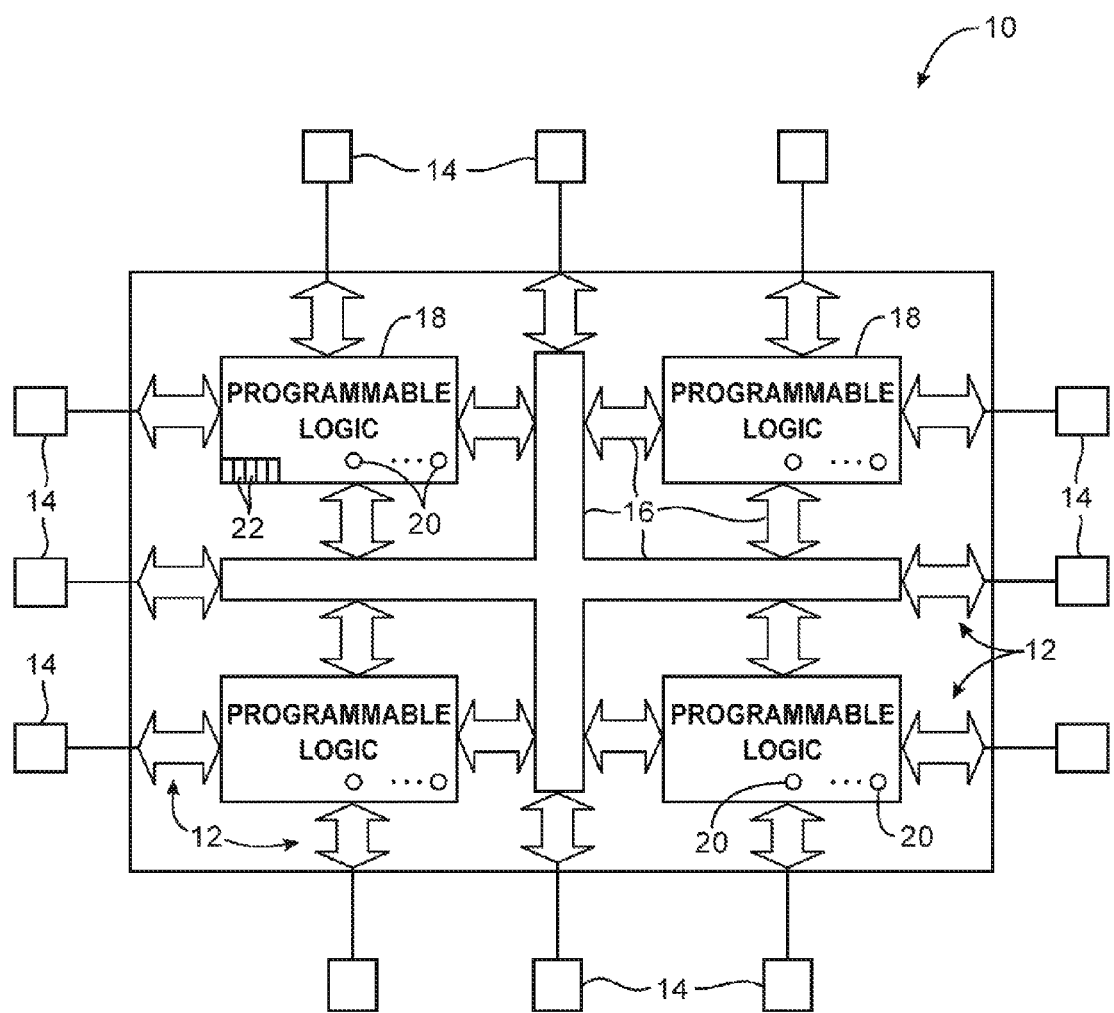
FIG. 1 is a diagram of an illustrative programmable integrated circuit in accordance with an embodiment of the present invention.

FIG. 1 is a diagram of an illustrative integrated circuit such as a programmable integrated circuit 10. Programmable device 10 may include input-output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include conductive lines and programmable connections between respective conductive lines and are therefore sometimes referred to as programmable interconnects 16.

Programmable device 10 may include programmable logic 18 that can be configured to perform a custom logic function. Programmable logic 18 may include combinational and sequential logic circuitry. The programmable interconnects 16 may be considered to be a type of programmable logic 18.

Device 10 may also contain programmable memory elements 20. Memory elements 20 can be loaded with configuration data (also called programming data) using pins 14 and input-output circuitry 12. Once loaded, the memory elements may each provide a corresponding static control signal that controls the operation of an associated logic component in programmable logic 18. In a typical scenario, the outputs of the loaded memory elements 20 are applied to the gates of metal-oxide-semiconductor transistors in programmable logic 18 to turn certain transistors on or off and thereby configure the logic in programmable logic 18 and routing paths. Programmable logic circuit elements that may be controlled in this way include pass transistors, parts of multiplexers (e.g., multiplexers used for forming routing paths in programmable interconnects 16), look-up tables, logic arrays, various logic gates, etc.

Memory elements 20 may be implemented using any suitable volatile and/or non-volatile memory structures such as random-access-memory (RAM) cells, fuses, antifuses, programmable read-only-memory memory cells, mask-programmed and laser-programmed structures, combinations of these structures, etc. Because memory elements 20 are loaded with configuration data during programming, memory elements 20 are sometimes referred to as configuration memory, configuration RAM (CRAM), or programmable memory elements.

The circuitry of device 10 may be organized using any suitable architecture. As an example, the logic of device 10 may be organized in a series of rows and columns of larger programmable logic regions each of which contains multiple smaller logic regions. The smaller regions may be, for example, regions of logic that are sometimes referred to as logic elements (LEs), each containing a look-up table (LUT), one or more registers, and programmable multiplexer circuitry. The smaller regions may also be, for example, regions of logic that are sometimes referred to as adaptive logic modules (ALMs). Each adaptive logic module may include a pair of adders, a pair of associated registers and a look-up table or other block of shared combinational logic (as an example). The larger regions may be, for example, logic array blocks (LABs) containing multiple logic elements or multiple ALMs. In the example of FIG. 1, illustrative logic regions 22 (which may be, for example, LEs or ALMs) are shown in one of the larger regions of programmable logic 18 in FIG. 1 (which may be, for example, a logic array block). In a typical programmable logic device 10, there may be hundreds or thousands of smaller logic regions 22. The logic regions 22 that are shown in FIG. 1 are merely illustrative.

During device programming, configuration data is loaded into device 10 that configures the programmable logic regions 22 and programmable logic regions 18 so that their logic resources perform desired logic functions on their inputs and produce desired output signals. For example, CRAM cells are loaded with appropriate configuration data bits to configure adders and other circuits on device 10 to implement desired custom logic designs.

The resources of device 10 such as programmable logic 18 may be interconnected by programmable interconnects 16. Interconnects 16 generally include vertical and horizontal conductors. These conductors may include global conductive lines that span substantially all of device 10, fractional lines such as half-lines or quarter lines that span part of device 10, staggered lines of a particular length (e.g., sufficient to interconnect several logic array blocks or other such logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

In addition to the relatively large blocks of programmable logic that are shown in FIG. 1, the device 10 generally also includes some programmable logic associated with the programmable interconnects, memory, and input-output circuitry on device 10. For example, input-output circuitry 12 may contain programmable input and output buffers. Interconnects 16 may be programmed to route signals to a desired destination.

Figure 2:
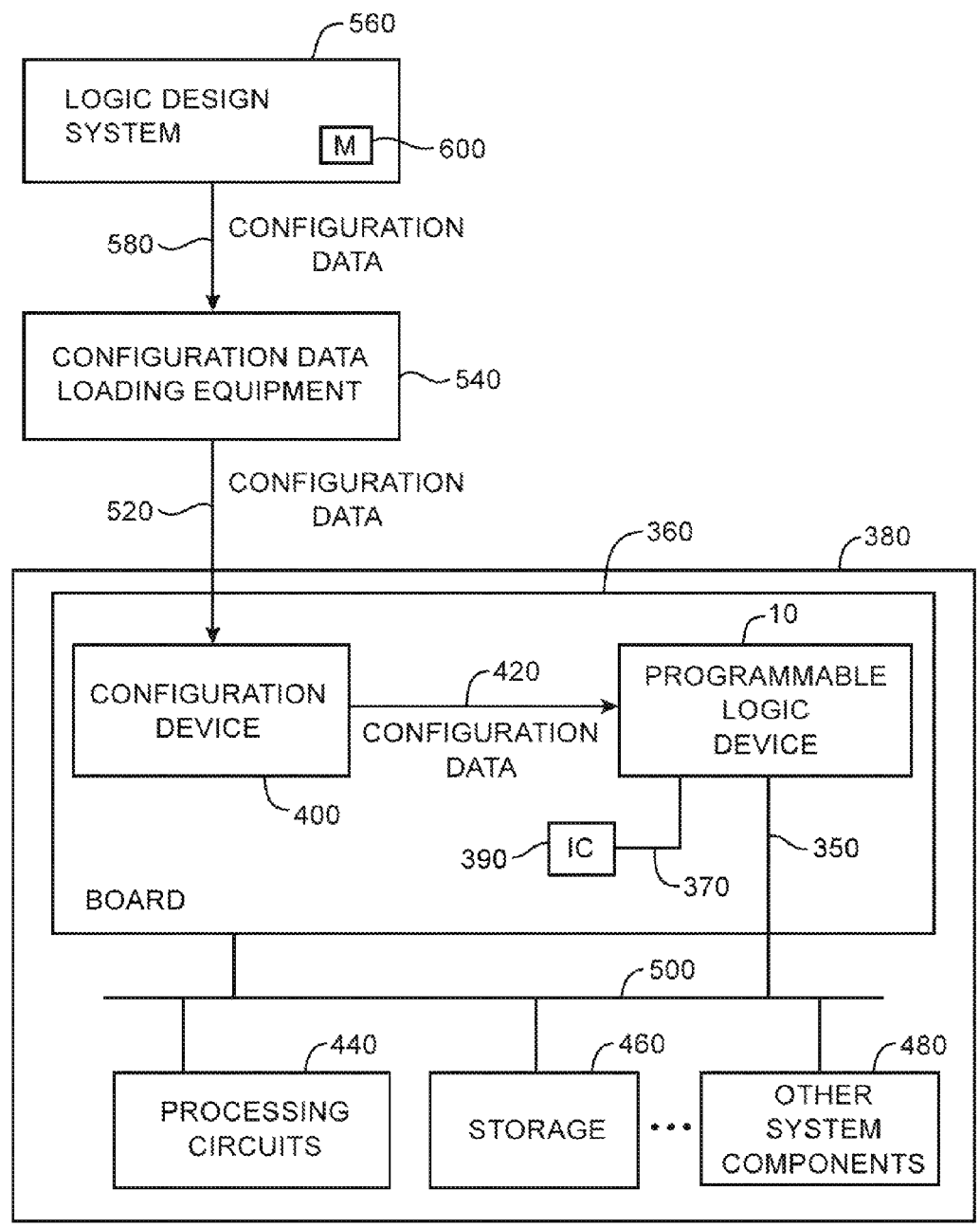
FIG. 2 is a diagram of an illustrative system environment in which a programmable integrated circuit may be configured using a logic design system in accordance with an embodiment of the present invention.

An illustrative system environment for designing and configuring a programmable integrated circuit 10 is shown in FIG. 2. Device 10 may be mounted on a board 360 in a system 380. Device 10 may receive configuration data from programming equipment or from any other suitable equipment or device.

In the example of FIG. 2, device 10 is a type of programmable integrated circuit that receives configuration data from an associated integrated circuit 400. With this type of arrangement, circuit 400 may, if desired, be mounted on the same board 360 as device 10. Circuit 400 may be a programmable logic device configuration data loading chip that loads configuration data into programmable logic device memory from an external electrically erasable-programmable read-only memory (EEPROM) chip, a programmable logic device configuration data loading chip with built-in memory (sometimes referred to as a configuration device), or any other suitable device. When system 380 boots up (or at another suitable time), the configuration data may be supplied to device 10 from device 400, as shown schematically by path 420. The configuration data that is supplied to device 10 may be stored in its programmable elements 20 (e.g., configuration random-access-memory elements).

System 380 may include processing circuits 440, storage 460, and other system components 480 that communicate with device 10. The components of system 380 may be located on one or more boards such as board 360 or other suitable mounting structures or housings.

Communication paths may be used to interconnect device 10 to other components. For example, communication path 370 may be used to convey data between an integrated circuit 390 that is mounted on board 360 and device 10. Communication paths 350 and 500 can be used to convey signals between device 10 and components 440, 460, and 480.

Configuration device 400 may be supplied with the configuration data for device 10 over a path such as path 520. Configuration device 400 may, for example, receive the configuration data from configuration data loading equipment 540 or other suitable equipment that stores the configuration data in configuration device 400. Device 400 may be loaded with data before or after installation on board 360.

It can be a significant undertaking to design and implement a desired logic circuit in a programmable logic device. Logic designers therefore generally use logic design systems based on computer-aided-design (CAD) tools to assist them in designing circuits. A logic design system (sometimes referred to as a circuit design system) can help a logic designer design and test complex circuits for a system. When a design is complete, the logic design system may be used to generate configuration data for electrically programming the appropriate programmable logic device. The logic design system may be implemented on computing equipment.

As shown in FIG. 2, the configuration data produced by a logic design system 560 may be provided to equipment 540 over a path such as path 580. Equipment 540 provides the configuration data to device 400 so that device 400 can later provide this configuration data to device 10 over path 420. System 560 may be based on one or more computers and one or more software programs. In general, software and data may be stored on any computer-readable medium (storage) in system 560 and is shown schematically as storage 600.

In a typical scenario, logic design system 560 is used by a logic designer to create a custom circuit design. The system 560 produces corresponding configuration data which is provided to configuration device 400. Upon power-up, configuration device 400 and data loading circuitry on device 10 is used to load the configuration data into the programmable memory elements 20 of device 10. Device 10 may then be used in normal operation of system 380.

Figure 3:
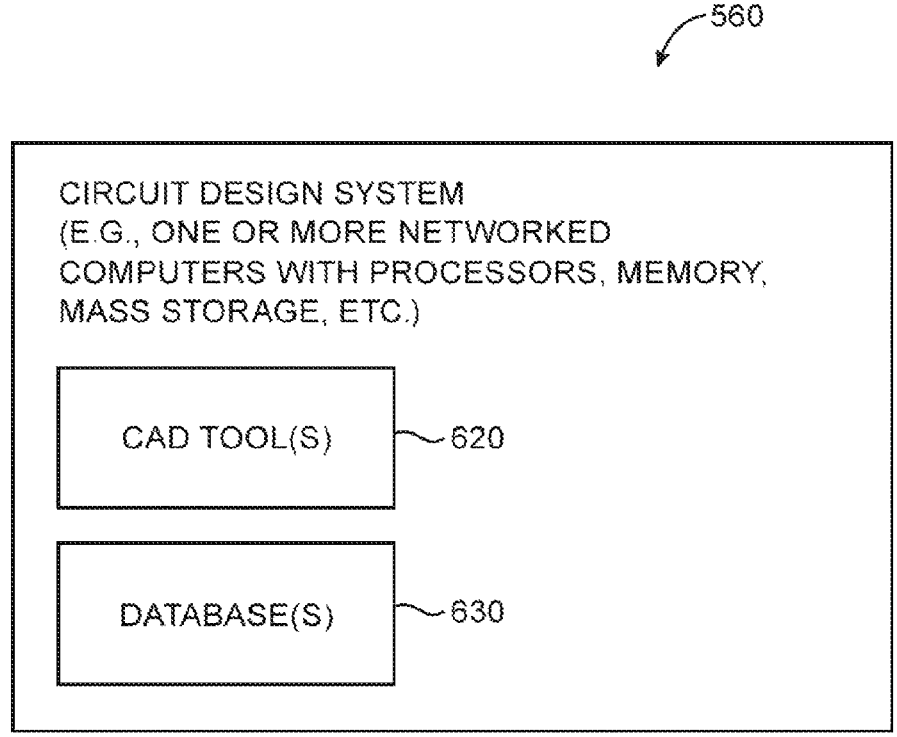
FIG. 3 is a diagram of a logic design system for generating configuration data for implementing custom circuit designs in programmable integrated circuits in accordance with an embodiment of the present invention.

An illustrative logic design system 560 in accordance with the present invention is shown in FIG. 3. System 560 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 620 and databases 630 reside on system 560. During operation, executable software such as the software of computer aided design tools 620 runs on the processor(s) of system 560. Databases 630 are used to store data for the operation of system 560. In general, software and data may be stored on any computer-readable medium (storage) in system 560. Such storage, which is shown schematically as storage 600 of FIG. 2, may include computer memory chips, removable and fixed media such as hard disk drives, flash memory, compact discs (CDs), DVDs, other optical media, and floppy diskettes, tapes, or any other suitable memory or storage device(s). When the software of system 560 is installed, the storage 600 of system 560 has instructions and data that cause the computing equipment in system 560 to execute various methods (processes). When performing these processes, the computing equipment is configured to implement the functions of the logic design system.

The computer aided design (CAD) tools 620, some or all of which are sometimes referred to collectively as a CAD tool, may be provided by a single vendor or multiple vendors. Tools 620 may be provided as one or more suites of tools (e.g., a compiler suite for performing tasks associated with implementing a circuit design in a programmable logic device) and/or as one or more separate software components (tools). Database(s) 630 may include one or more databases that are accessed only by a particular tool or tools and may include one or more shared databases. Shared databases may be accessed by multiple tools. For example, a first tool may store data for a second tool in a shared database. The second tool can access the shared database to retrieve the data stored by the first tool. This allows one tool to pass information to another tool. Tools may also pass information between each other without storing information in a shared database if desired.

Figure 4:
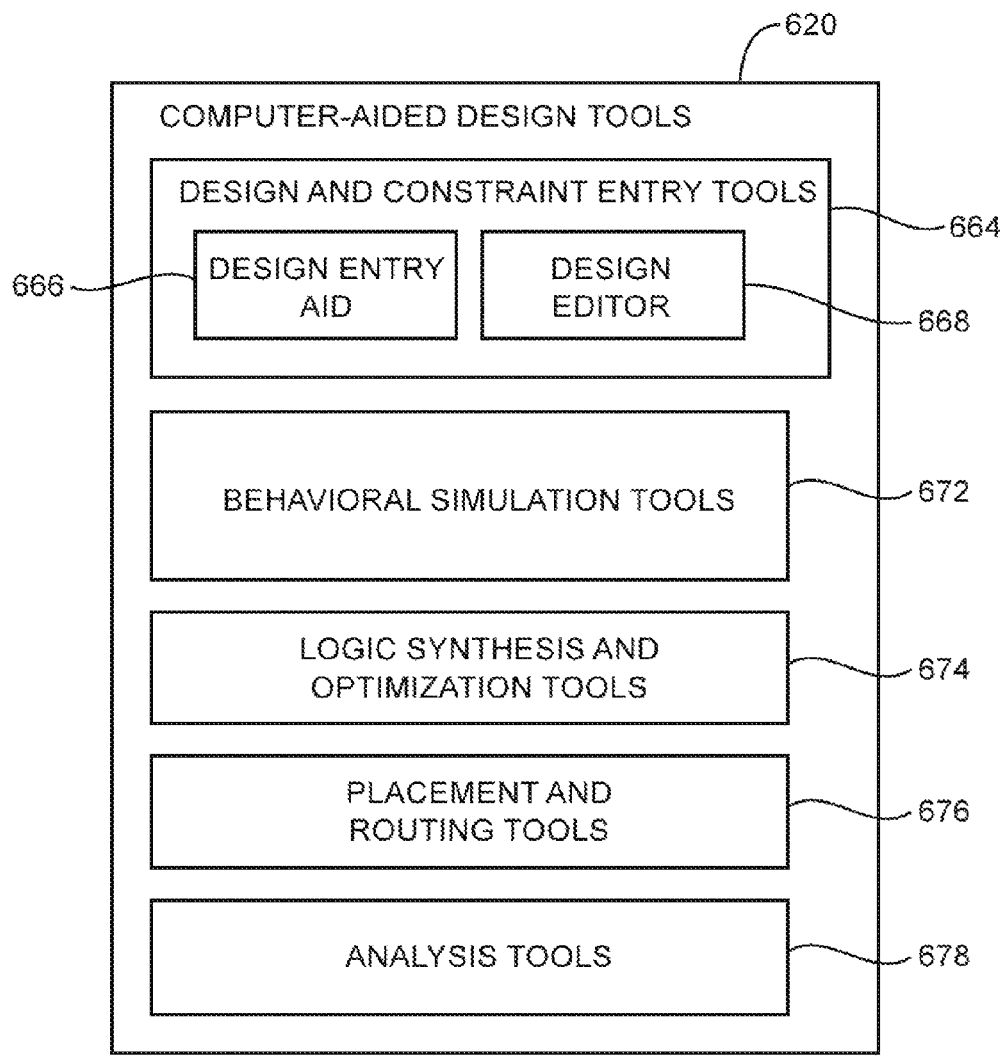
FIG. 4 is a diagram of illustrative computer-aided design (CAD) tools that may be used in a logic design system in accordance with an embodiment of the present invention.

Illustrative computer aided design tools 620 that may be used in a logic design system such as system 560 of FIGS. 2 and 3 are shown in FIG. 4.

The design process typically starts with the formulation of logic circuit functional specifications (e.g., a functional description of the logic circuit). A logic designer can specify how a desired circuit should function using design and constraint entry tools 664. Design and constraint entry tools 664 may include tools such as design and constraint entry aid 666 and design editor 668. Design and constraint entry aids such as aid 666 may be used to help a logic designer locate a desired design from a library of existing logic designs and may provide computer-aided assistance to the logic designer for entering (specifying) the desired design.

As an example, design and constraint entry aid 666 may be used to present screens of options for a user. The user may click on on-screen options to select whether the circuit being designed should have certain features. Design editor 668 may be used to enter a design (e.g., by entering lines of hardware description language code), may be used to edit a design obtained from a library (e.g., using a design and constraint entry aid), or may assist a user in selecting and editing appropriate prepackaged code/designs.

Design and constraint entry tools 664 may be used to allow a logic designer to provide a desired logic design using any suitable format. For example, design and constraint entry tools 664 may include tools that allow the logic designer to enter a logic design using truth tables. Truth tables can be specified using text files or timing diagrams and may be imported from a library. Truth table logic design and constraint entry may be used for a portion of a large circuit or for an entire circuit.

As another example, design and constraint entry tools 664 may include a schematic capture tool. A schematic capture tool may allow the logic designer to visually construct logic circuits from constituent parts such as logic gates and groups of logic gates. Libraries of preexisting logic circuits may be used to allow a desired portion of a design to be imported with the schematic capture tools.

If desired, design and constraint entry tools 664 may allow the logic designer to provide a logic design to the logic design system 560 using a hardware description language such as Verilog hardware description language (HDL) or Very High Speed Integrated Circuit Hardware Description Language (VHDL). The designer of the logic circuit can enter the logic design by writing hardware description language code with editor 668. Blocks of code may be imported from user-maintained or commercial libraries if desired.

After the design has been entered using design and constraint entry tools 664, behavioral simulation tools 672 may be used to simulate the functional performance of the design. If the functional performance of the design is incomplete or incorrect, the logic designer can make changes to the design using design and constraint entry tools 664. The functional operation of the new design can be verified using behavioral simulation tools 672 before synthesis operations have been performed using tools 674. Simulation tools such as tools 672 may also be used at other stages in the design flow if desired (e.g., after logic synthesis). The output of the behavioral simulation tools 672 may be provided to the logic designer in any suitable format (e.g., truth tables, timing diagrams, etc.).

Once the functional operation of the logic design has been determined to be satisfactory, logic synthesis and optimization tools 674 may be used to implement the logic design in a particular programmable logic device (i.e., in the logic and interconnect resources of a particular programmable logic device product or product family).

Tools 674 attempt to optimize the design by making appropriate selections of hardware to implement different logic functions in the logic design based on the logic design data and constraint data entered by the logic designer using tools 664.

After logic synthesis and optimization using tools 674, the logic design system may use tools such as placement and routing tools 676 to perform physical design steps (layout synthesis operations). Placement and routing tools 676 are used to determine how to place the circuits for each logic function within the programmable logic device. For example, if two counters interact with each other, the placement and routing tools 676 may locate these counters in adjacent logic regions on the programmable logic device to reduce interconnect delays or to satisfy timing requirements specifying the maximum permitted interconnect delay. The placement and routing tools 676 create orderly and efficient implementations of logic designs for a given programmable logic device.

Tools such as tools 674 and 676 may be part of a compiler suite (e.g., part of a suite of compiler tools provided by a programmable logic device vendor). In accordance with the present invention, tools such as tools 674, 676, and 678 may automatically take into account the effects of crosstalk between interconnects while implementing a desired circuit design. Tools 674, 676, and 678 may also include timing analysis tools. This allows tools 674 and 676 to satisfy performance requirements (e.g., timing requirements) when generating configuration data for programming integrated circuits such as programmable integrated circuit 10.

After an implementation of the desired logic design in the programmable logic device has been generated using placement and routing tools 676, the implementation of the design may be analyzed and tested using analysis tools 678. After satisfactory optimization operations have been completed using tools 620, tools 620 can produce the configuration data for the programmable logic device.

Figure 5:
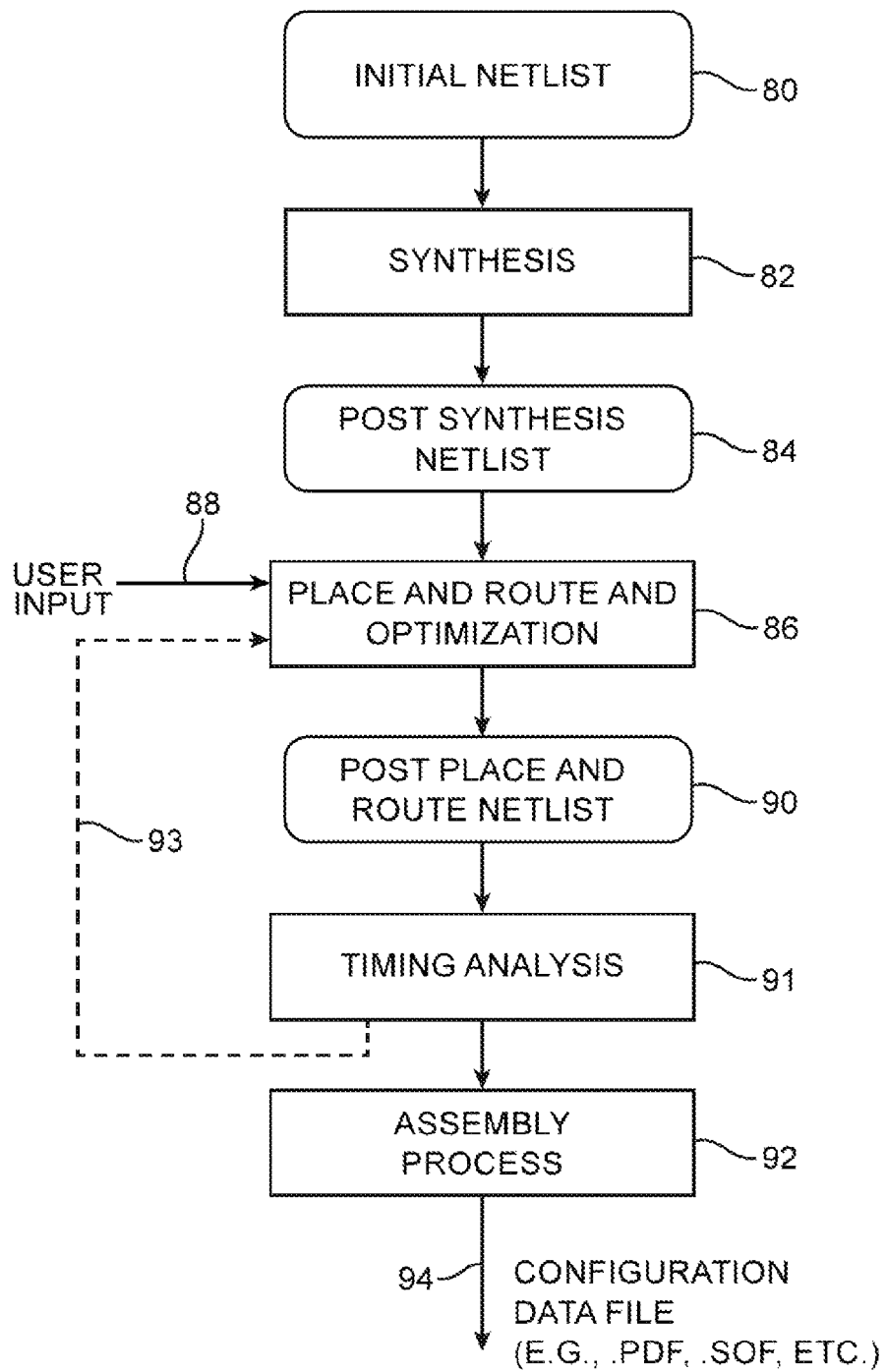
FIG. 5 is a flow chart of illustrative steps for designing a custom logic circuit and performing timing analysis in accordance with an embodiment of the present invention.

Illustrative operations involved in using tools 620 of FIG. 4 to produce configuration data files are shown in FIG. 5. As shown in FIG. 5, an initial netlist 80 is synthesized at step 82 to produce a post-synthesis netlist 84. At step 86, user input 88 and the post synthesis netlist 84 are processed during place and route and optimization operations. During the operations of step 86, the CAD tools 620 take account of the effects of using different positive power supply voltages and/or body bias voltages and, through appropriate selection of power supply and body bias levels, circuit resource assignments, and placement decisions, tools 620 reduce power consumption while satisfying design constraints.

The resulting netlist 90 may be processed further by performing a timing analysis using logic design system 560 (step 91). The timing analysis may be used to help ensure that the final netlist 90 satisfies timing constraints before configuring programmable integrated circuit 10. If desired, processing may optionally loop back to step 86 via path 93 to perform additional optimizations using the final netlist. For example, logic design system 560 may identify routing paths in the final netlist that fail timing constraints and determine replacement routing paths by returning to step 86 via optional path 93.

At step 92, the final netlist may be processed further during an assembly process to produce a configuration data file output (e.g., a .pof or .sof file). The configuration data file output may then be loaded onto programmable device 10.

Figure 6:
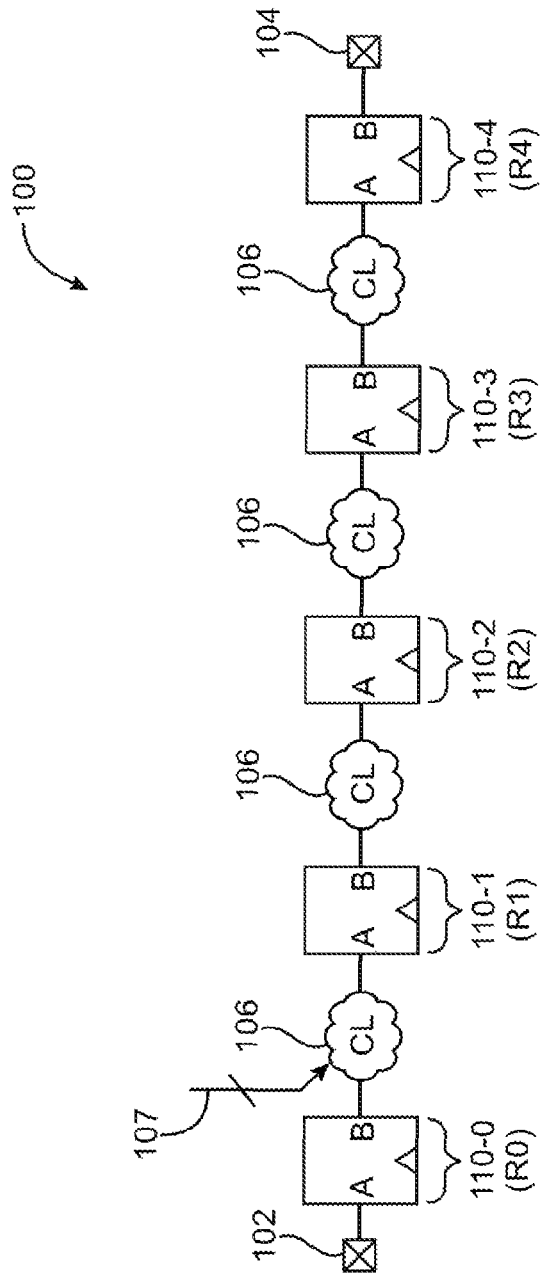
FIG. 6 is a diagram of an illustrative chain of bypassable clocked storage elements and combinational logic delay elements in accordance with an embodiment of the present invention.

FIG. 6 shows one suitable embodiment of the present invention in which device 10 includes a logic data path such as data path 100. As shown in FIG. 6, data path 100 may be coupled between an input 102 and an output 104. The speed at which data is conveyed from input 102 to output 104 and the speed at which data is generated at output 104 may have to be greater than predetermined threshold levels to satisfy performance criteria. Terminals 102 and 104 may therefore sometimes be referred to as a speed critical input and a speed critical output, respectively, and data path 100 may be referred to as a critical data path.

Multiple storage elements such as clocked storage elements 110 may be interposed in data path 100 between terminals 102 and 104. In the example of FIG. 6, first clocked storage element 110-0 (also indicated as register R0), second clocked storage element 110-1 (also indicated as register R1), third clocked storage element 110-2 (also indicated as register R2), fourth clocked storage element 110-3 (also indicated as register R3), and fifth clocked storage element 110-4 (also indicated as register R4). Clocked storage elements 110 (e.g., registers R0-R4) may be sequential logic circuits generally known as registers having an input A and an output B. In some embodiments, elements 110 may be implemented using edge-triggered register circuits sometimes referred to as flip-flops (e.g., a positive edge-triggered flip-flop or a negative edge-triggered flip-flop). In other embodiments, elements 110 may be implemented using level-sensitive latches such as pulse latches. These examples are merely illustrative. If desired, elements 110 may be implemented using other types of sequential or clock-controlled storage components.

Combinational logic (CL) such as combinational logic delay element 106 may be coupled between each adjacent pair of clocked (sequential) storage elements 110. Delay elements may include logic gates, interconnect paths, and/or other programmable logic circuitry. In the example of FIG. 6, first logic delay element 106 may be coupled in the data path between the output of register R0 and the input of register R1, second logic delay element 106 may be coupled in the data path between the output of register R1 and the input of register R2, third logic delay element 106 may be coupled in the data path between the output of register R2 and the input of register R3, and fourth logic delay element 106 may be coupled in the data path between the output of register R3 and the input of register R4. Each combinational logic delay element 106 may have other inputs such as inputs 107 capable of receiving other data signals over non-critical data paths. When determining the maximum operating frequency for device 10, only the throughput of the speed-critical data path needs to be analyzed (e.g., the critical data path includes the largest combinational delay between any two adjacent sequential circuits).

In accordance with an embodiment of the present invention, device 10 may be provided with dynamic voltage-frequency scaling (DVFS) capabilities. In other words, data path 100 may be operated at various operating frequencies and at different power supply voltage levels (e.g., the logic circuitry on device 10 may be operated at different voltage-frequency settings or "states"). Device 10 may be capable of dynamically switching from one state to another without having to reconfigure the integrated circuit with a new set of configuration data.

In particular, voltage scaling at fixed operating frequencies can be performed by operating sequential elements 110 as "bypassable" clocked storage elements. For example, each register 110 may be placed in a normal mode or a bypass mode. When register 110 is placed in normal mode, register 110 is switched into use and is capable of latching data at its input and presenting corresponding latched data at its output. When register 110 is placed in bypass (or transparent) mode, register 110 is effectively switched out of use and any data that is presented at its input is passed directly to its output. The different voltage-frequency operating settings (assuming the appropriate clocked storage elements have been enabled) may be verified to satisfy design criteria by performing desired timing analysis 91 with design tools 620.

Figure 7:
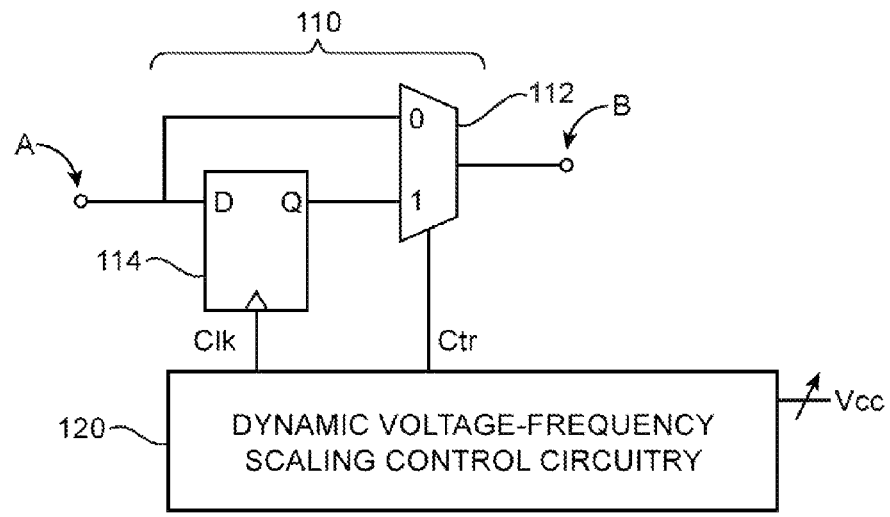
FIGS. 7 and 8 are circuit diagrams of illustrative bypassable clocked storage elements in accordance with an embodiment of the present invention.

FIG. 7 is a circuit diagram showing one suitable arrangement of bypassable clocked storage element 110. As shown in FIG. 7, clocked storage element 110 may include a register 114 and a multiplexing circuit 112 that are controlled by associated dynamic voltage-frequency scaling (DVFS) control circuitry 120. Register 114 may be an edge-triggered flip-flop or a level-sensitive latch (e.g., a pulse latch). Register 114 may have a data input D that serves as input terminal A for element 110, an output Q, and a clock input. Multiplexer 112 may have a first (0) input that is coupled to the data input of register 114, a second (1) input that is coupled to output Q of register 114, an output that serves as output terminal B for element 110, and a control input.

Control circuitry 120 may be used to generate an adjustable clock signal Clk to the clock input of register 114, a control signal Ctr to the control input of multiplexer 112, and an adjustable power supply voltage Vcc for powering circuitry in data path 100. Control circuitry 120 may assert signal Ctr to place clocked storage element 110 in normal mode (e.g., to configure multiplexer 112 to route signals from its second input to its output) and may deassert signal Ctr to place clocked storage element 110 in bypass mode (e.g., to configure multiplexer 112 to route signals from its first input to its output). Dynamic voltage-frequency scaling control circuitry 120 may also be used to adjust the frequency of signal Clk and the voltage level of Vcc when performing voltage-frequency scaling operations.

Figure 8:
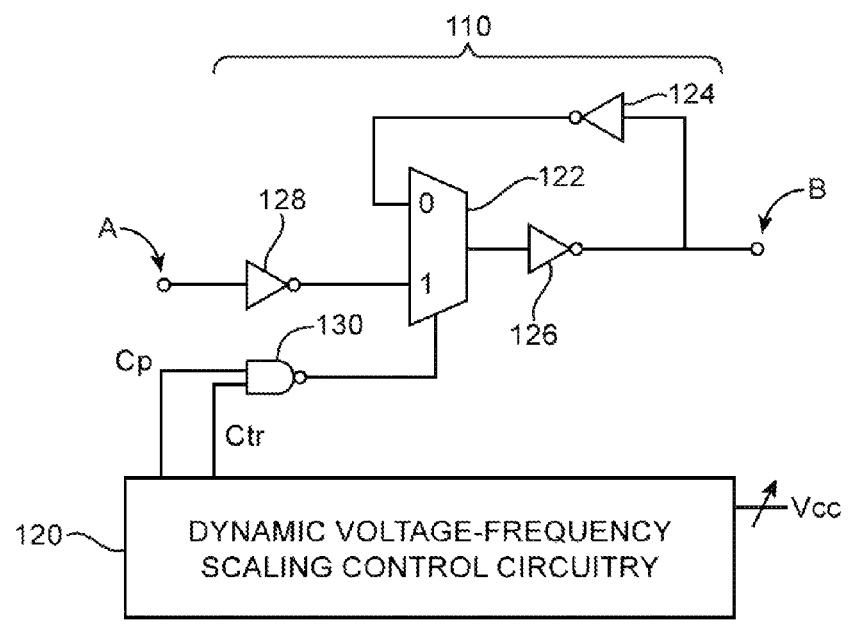

FIG. 8 is a circuit diagram showing another suitable arrangement of bypassable clocked storage element 110. As shown in FIG. 8, clocked storage element 110 may include a logic NAND gate 130, a multiplexer 122, and inverters 124, 126, and 128. Inverter 128 may have an input that serves as the input terminal A of element 110 and an output. Multiplexer 122 may have a first (0) input, a second (1) input that is coupled to the output of inverter 128, an output, and a control input. Inverter 126 may have an input that is coupled to the output of multiplexer 122 and an output that serves as the output terminal B of element 110. Inverter 124 may have an input that is coupled to the output of inverter 126 and an output that is coupled to the first input of multiplexer 124. Connected in this cross-coupled configuration, inverters 124 and 126 may serve as a latching circuit when multiplexer 122 is configured to route signals from its first input to its output.

Logic NAND gate may have first and second inputs that receive clock pulse signal Cp and control signal Ctr, respectively, from DVFS control circuitry 120 and may have an output that is coupled to the control input of multiplexer 122. Control circuitry 120 may be used to generate adjustable clock pulse signal Cp (e.g., a clock signal with an adjustable pulse width), control signal Ctr, and an adjustable power supply voltage Vcc for powering circuitry in data path 100. Control circuitry 120 may assert signal Ctr to place clocked storage element 110 in normal mode (e.g., signal Cp may be passed to multiplexer 122) and may deassert signal Ctr to place clocked storage element 110 in bypass mode (e.g., by forcing the control input of multiplexer 122 at a high voltage level with gate 130). In other words, multiplexing circuit 122 may be configured to electrically connect inverters 124 and 126 in the cross-coupled configuration when element 110 is placed in the normal mode and may be configured to break the cross-coupled configuration when element 110 is placed in the bypass mode. Dynamic voltage-frequency scaling control circuitry 120 may also be used to adjust the frequency of signal Clk and the voltage level of Vcc when performing voltage-frequency scaling operations.

The arrangement of FIG. 7 features an edge-triggered register-based implementation, whereas the arrangement of FIG. 8 features a level-sensitive latch-based implementation. These examples are merely illustrative and do not serve to limit the scope of the present invention. If desired, other suitable ways of implement similar types of bypassable clocked storage elements may be used.

Figure 9A:
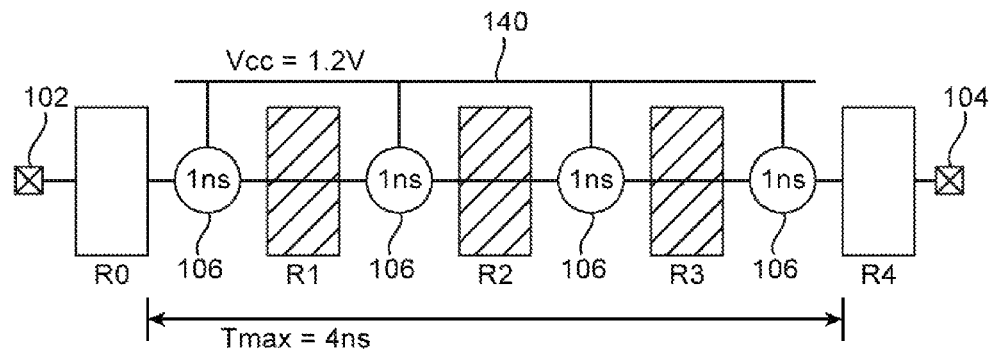
FIGS. 9A, 9B, and 9C are diagrams showing the chain of bypassable clocked storage elements and combinational delay elements of FIG. 6 configured to operate in different voltage-frequency states in accordance with an embodiment of the present invention.
Figure 9B:
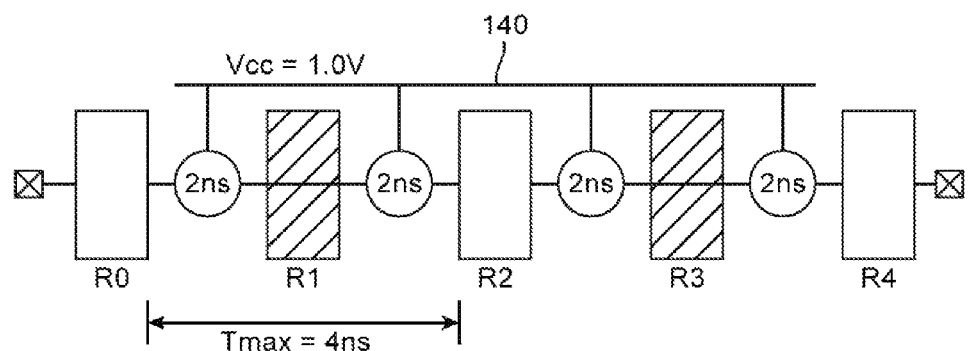
Figure 9C:
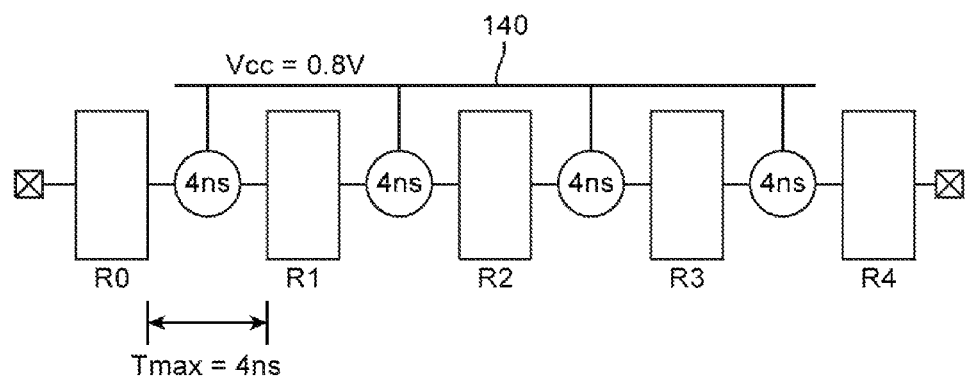

FIGS. 9A, 9B, and 9C are diagrams that illustrate how data path 100 can be controlled to provide voltage scaling at a given operating frequency. As shown in FIG. 9A, a supply voltage Vcc of 1.2 V may be provided to logic delay elements 106 from control circuitry 120 via power supply line 140. In the example of FIG. 9A, each logic delay element 106 exhibits a one nanosecond propagation delay when supplied with Vcc of 1.2 V. By disabling bypassable elements R1, R2, and R3 (i.e., by placing elements R1-R3 in bypass mode), the total propagation delay between input register R0 and output register R4 is therefore approximately equal to four nanoseconds, with a two cycle latency from input to output. As a result, the maximum clock frequency at which the non-bypassed registers R0 and R4 may be operated is at 250 MHz (one divided by 4 ns).

In another suitable arrangement, control circuitry 120 may scale voltage Vcc down to 1.0 V to reduce power consumption (see, e.g., FIG. 9B). When Vcc is lowered, each logic delay element 106 may exhibit a relative higher propagation delay of two nanoseconds. By selectively disabling bypassable elements R1 and R3 while enabling elements R0, R2, and R4, the maximum propagation delay between any two adjacent active (or non-disabled/non-bypassed) sequential circuit 110 will still be approximately equal to four nanoseconds, except with a three cycle latency from input to output. Because the worst-case register-to-register delay remains fixed at four nanoseconds, the maximum clock frequency at which the non-bypassed (active) registers R0, R2, and R4 may be operated is still equal to 250 MHz.

In another suitable arrangement, control circuitry 120 may scale voltage Vcc down to 0.8 V to further reduce power consumption (see, e.g., FIG. 9C). When Vcc is lowered to 0.8 V, each logic delay element 106 may exhibit an even higher propagation delay of four nanoseconds. By enabling all the bypassable elements in data path 100, the maximum propagation delay between any two adjacent active sequential circuits 110 will still be approximately equal to four nanoseconds, except with a five cycle latency from input to output. Because the worst-case register-to-register delay remains fixed at four nanoseconds, the maximum clock frequency at which the active registers R0-R4 may be operated is still equal to 250 MHz.

As shown in the examples of FIGS. 9A, 9B, and 9C, voltage scaling can be performed while the clock frequency is maintained at 250 MHz by selectively enabling/disabling the bypassable clocked storage elements 110 along the critical data path. Voltage scaling at a fixed frequency can be performed dynamically without having to reconfigure integrated circuit 10 with a new set of configuration data (as an example). Placing more registers 110 along the data path in normal mode effectively provides additional pipeline stages and can be used to enable lower voltage operation at the cost of increased latency.

If desired, voltage Vcc can be further reduced below 0.8 V. Because all bypassable elements 110 have already by enabled, lowering voltage Vcc below 0.8 V would, however, require a reduction in operating frequency to be less than 250 MHz in order to satisfy data path timing requirements (e.g., the clock speed is limited by the maximum delay between any two adjacent sequential circuits 110). For example, a reduction of Vcc from 0.8 V to 0.6 V may warrant a performance reduction from 250 MHz to 125 MHz.

In general, the bypassable register element that is coupled to speed critical input 102 and the bypassable register element that is coupled to speed critical output 104 need not be bypassed. In practice, delay elements 106 will not always exhibit the same delay and may not always scale uniformly with adjustments in voltage Vcc. As an example, interconnect delays are less sensitive to voltage variation than logic gate delays.

Figure 10:
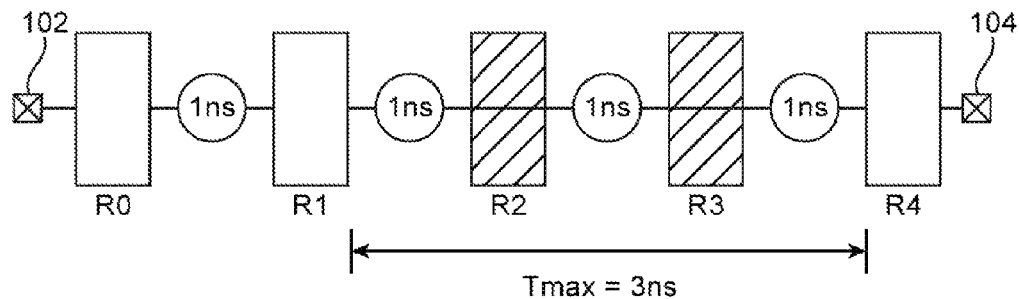
FIG. 10 is a diagram showing a suboptimal voltage-frequency scaling configuration in accordance with an embodiment of the present invention.

Bypassable clocked storage elements 110 may be enabled in an asymmetrical fashion (see, e.g., FIG. 10). As shown in FIG. 10, register R1 is enabled while registers R2 and R3 are disabled. As a result, the delay between active registers R0 and R1 is only one nanosecond, whereas the delay between active registers R1 and R4 is equal to three nanoseconds. The maximum operating frequency is therefore limited by the maximum of the two delays. In this example, since asymmetrically enabling the bypassable register elements produced substantially uneven delays, a suboptimal configuration results since the operating frequency can be simply improved by enabling additional unused registers in the data path (i.e., elements R2 and R3).

Figure 11:
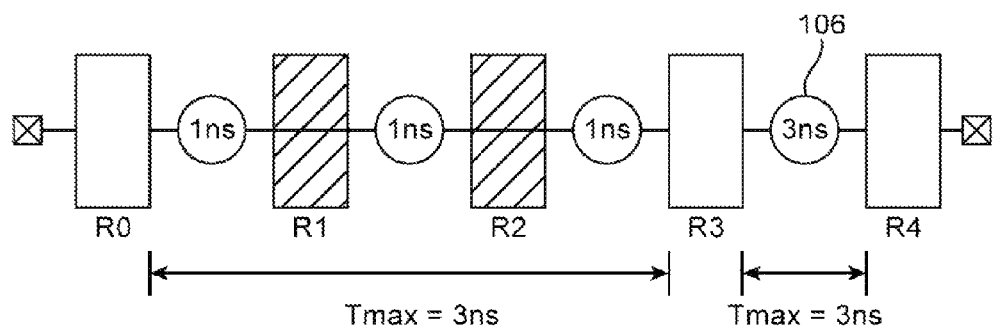
FIG. 11 is a diagram showing an optimal voltage-frequency scaling configuration in accordance with an embodiment of the present invention.

In certain situations, however, it may be desirable to enable clocked storage elements 110 in an asymmetrical fashion. FIG. 11 illustrates a scenario in which the delays associated with logic elements 106 are substantially mismatched. As shown in FIG. 11, delay element 106 coupled between register R3 and R4 may exhibit a delay of three nanoseconds, whereas each element 106 coupled between registers R0 and R3 only exhibit a one nanosecond delay. By bypassing registers R1 and R2, the delay between active registers R0 and R3 is three nanoseconds, whereas the delay between active registers R3 and R4 is also equal to three nanoseconds. In this example, since asymmetrically enabling the bypassable register elements produced substantially even delays and lower latency relative to an arrangement in which registers R1 and R2 are unnecessarily enabled, a more optimal configuration is obtained than would otherwise have been possible if only symmetrical register enabling schemes were provided.

The exemplary data path in which five bypassable clocked storage elements are coupled between input 102 and output 104 is merely illustrative. If desired, more or less than five bypassable clocked storage elements 110 may be interposed in any given data path on device 10.

Figure 12:
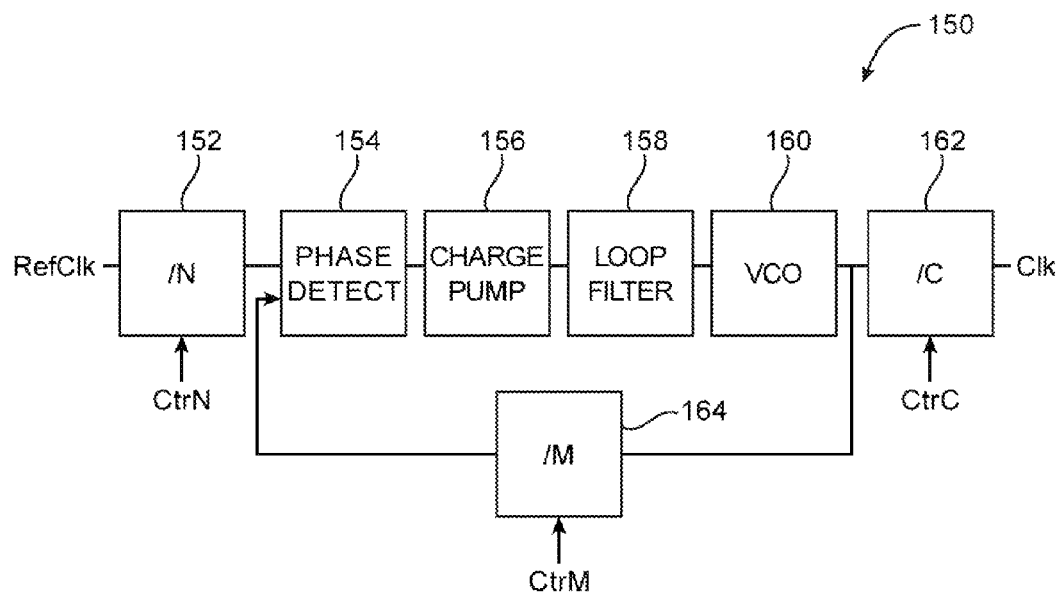
FIG. 12 is a diagram of an illustrative phase-locked-loop (PLL) with programmable dividers in accordance with an embodiment of the present invention.

As shown in FIGS. 7 and 8, DVFS control circuitry 120 may be used to generate adjustable clock signals and/or clock pulses. In one suitable arrangement, DVFS control circuitry 120 may include an adjustable phase-locked loop (PLL) circuit 150 for generating an adjustable clock signal Clk (see, e.g., FIG. 12). As shown in FIG. 12, phase-locked loop 150 may include an input divider 152, a phase detector 154, a charge pump 156, a loop filter 158, a voltage-controlled oscillator (VCO) 160, an output divider 162, and a feedback divider 164. Input divider may receive a reference clock signal RefClk having a frequency fref. Phase detector 154, charge pump 156, loop filter 158, and VCO 160 may be coupled in series between input divider 152 and output divider 162. Feedback divider 164 may be coupled between an output of VCO 160 and an input of phase detector 154.

Dividers 152, 162, and 164 may be adjustable divider circuits. For example, divider 152 may receive a control signal CtrN generated using control circuitry 120 that tunes a division factor N that is provided by divider 152. Divider 162 may receive a control signal CtrC generated using control circuitry 120 that tunes a division factor C that is provided by divider 162. Similarly, divider 164 may receive a control signal CtrM generated using control circuitry 120 that tunes a division factor M that is provided by divider 164. Phase-locked loop 150 controlled in this way may output clock signal Clk having an output frequency that is equal to the product of fref and M divided by the product of N and C (fref*M/(N*C)).

Figure 13:
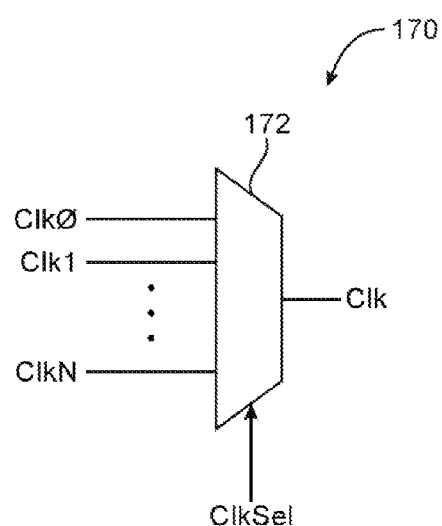
FIG. 13 is a diagram of an illustrative clock signal selection circuit in accordance with an embodiment of the present invention.

FIG. 13 shows another suitable way of outputting an adjustable clock signal. As shown in FIG. 13, a clock selection circuit 170 may be provided that receives a plurality of clock signals with different respective frequencies. In particular, clock selection circuit 170 may include a multiplexer 172 having inputs that receive clock signals Clk0, Clk1, . . . , and ClkN. Clock signals Clk0-ClkN may represent clock signals with different frequencies that are generated using an on-chip clock source (e.g., a PLL circuit) or that are received from an off-chip clock source. Multiplexer 172 may be controlled using signal ClkSel that is generated using control circuitry 120 for selecting which one of signals Clk0-ClkN is passed to the output of multiplexer 172 as signal Clk.

FIGS. 12 and 13 show merely two different ways of providing an adjustable clock signal. If desired, adjustable clock pulses Cp can also be generated in a similar fashion. If desired, other ways of generating tunable periodic signals over a continuous frequency range may be used.

Figure 14:
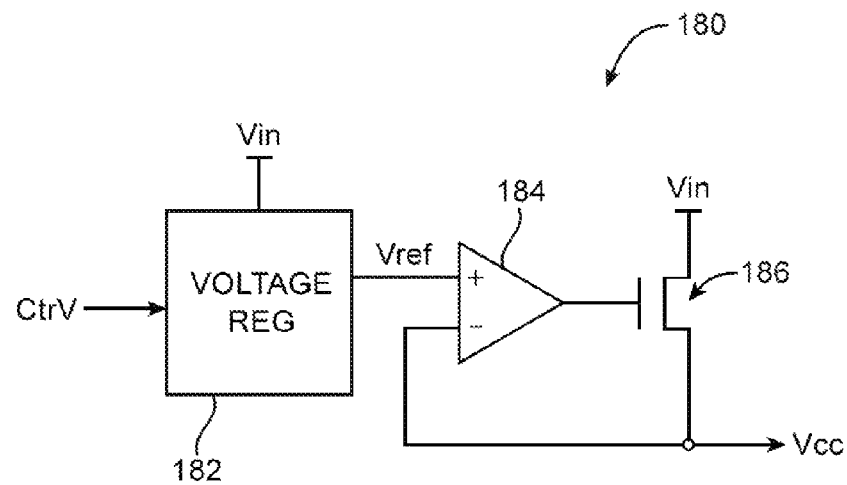
FIG. 14 is a diagram of an illustrative programmable voltage regulator in accordance with an embodiment of the present invention.

Control circuitry 120 may also be used to generate adjustable power supply voltage Vcc. In one suitable arrangement, DVFS control circuitry 120 may include a tunable power supply circuit 180 for generating an adjustable power supply voltage Vcc (see, e.g., FIG. 14). As shown in FIG. 14, power supply circuit 180 may include a voltage regulator 182, an operational amplifier 184, and a transistor 186. Voltage regulator 182 may receive an input voltage Vin from an off-chip power source and may be used to provide a regulated reference voltage Vref. Reference voltage Vref may have a voltage level that is controlled using control signal CtrV that is generated using control circuitry 120 (as an example). Control signal CtrV may be a digital control signal or an analog control signal.

Operational amplifier 184 may have a first (positive) input that receives Vref from regulator 182, a second (negative) input on which power supply voltage Vcc is provided, and an output. The transistor may have a first source-drain terminal that receives input voltage Vin, a second source-drain terminal that is coupled to the second input of amplifier 184, and a gate terminal that is coupled to the output of amplifier 184. Supply voltage Vcc may be adjusted by varying the voltage level of Vref (e.g., the voltage level of Vcc may be set equal to the voltage level of Vref).

Figure 15:
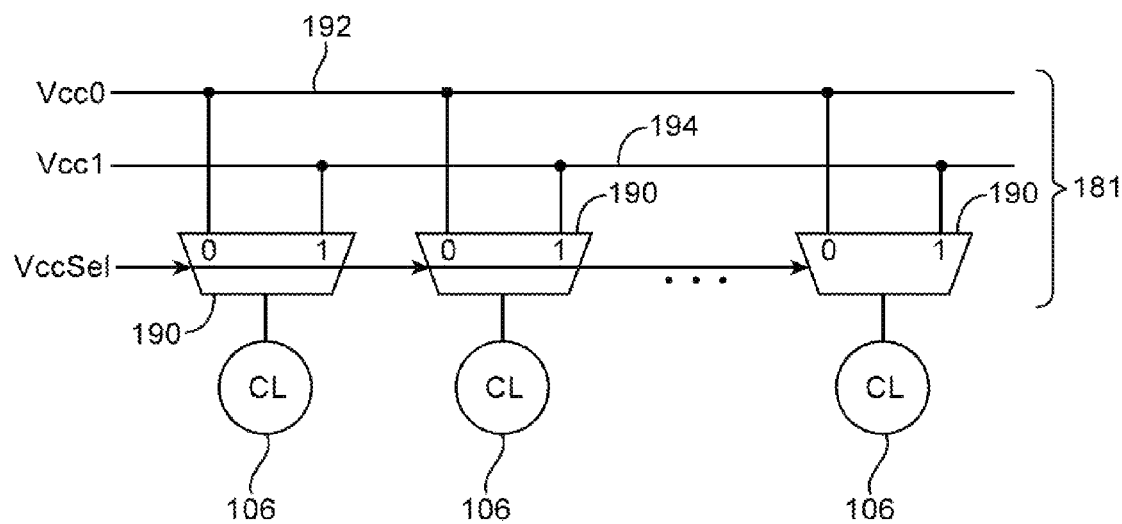
FIG. 15 is a diagram of an illustrative supply voltage selection circuit in accordance with an embodiment of the present invention.

FIG. 14 shows one suitable way of providing different power supply voltage signals to the different combination logic circuits 106. As shown in FIG. 14, a voltage selection circuit 181 may be provided that receives a plurality of power supply voltage signals with different magnitudes. In particular, voltage selection circuit 181 may include multiple multiplexing circuits 190 each of which has a first input that receives first power supply voltage Vcc0 from first power supply line 192, a second input that receives second power supply voltage Vcc1 from second power supply line 194, a control input that receives control signal VccSel generated using control circuitry 120, and an output that is fed to the power supply terminal associated with the corresponding combination logic circuits 106. Power supply voltages Vcc0 and Vcc1 may have different magnitudes and may be generated using different power supply circuits 180 or may be received from off-chip power sources. Control circuitry 120 may set VccSel low to route Vcc0 to each of the delay elements 106 or may set VccSel high to route Vcc1 to each of the delay elements 106. The configuration of FIG. 15 is merely illustrative. If desired, voltage selection circuit 181 may be configured to select among more than two different power supply voltage levels to offer a wider voltage scaling range. If desired, controller 120 may also produce multiple unique VccSel signals so that different combinational logic blocks receive different voltages depending on their performance requirements.

FIGS. 14 and 15 show merely two different ways of generating/providing multiple supply voltage levels on device 10. If desired, other ways of generating tunable voltage signals over a continuous voltage range may be used.

Figure 16:
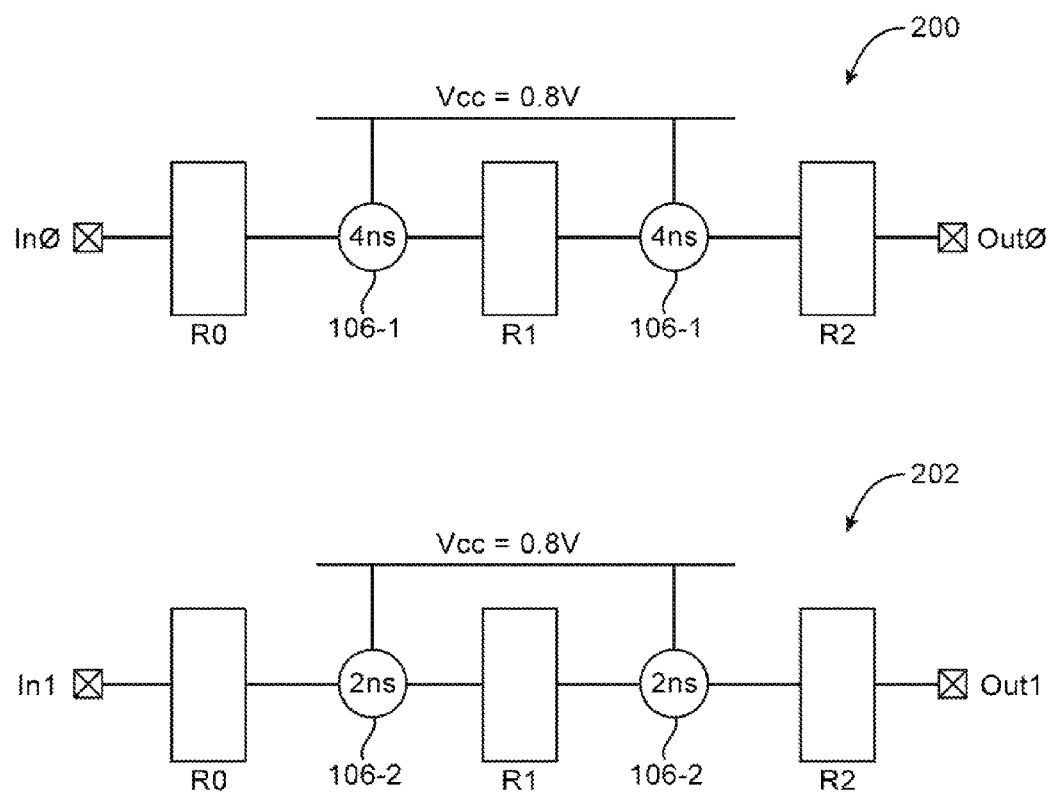
FIG. 16 is a diagram showing two illustrative data paths with balanced latencies in accordance with an embodiment of the present invention.

It may be desirable for different data paths on device 10 to exhibit matched or "balanced" latencies. FIG. 16 illustrates a scenario in which a first data path 200 and a second data path 202 each include a chain of three bypassable clocked components 110. In particular, first data path 200 includes bypassable clocked components R0, R1, and R2 coupled between data path input In0 and data path output Out0, where first logic circuit 106-1 that is interposed between R0 and R1 and second logic circuit 106-1 that is interposed between R1 and R2 receive a Vcc of 0.8 V and each exhibit a propagation delay of 4 ns. On the other hand, second data path 202 includes bypassable clocked components R0, R1, and R2 coupled between data path input In1 and data path output Out1, where first logic circuit 106-2 that is interposed between R0 and R1 in the second data path and second logic circuit 106-2 that is interposed between R1 and R2 in the second data path also receive a Vcc of 0.8 V but each exhibit a propagation delay of only 2 ns.

In this scenario, register R1 in the first data path 200 may be switched into use in order to maintain a satisfactory clocking frequency at this low voltage operation. Even though it may not be necessary to enable register R1 in the second data path 202 (e.g., since the delay of elements 106-2 is substantially less than that of elements 106-1), register R1 in the second data path may still be switched into use so that the latency of both data paths 200 and 202 are balanced. Balancing latencies in this way ensures that relative latency requirements for different data paths on device 10 are satisfied.

Thus far, the data paths of the type described in connection with FIGS. 6, 9A, 9B, 9C, 10, and 11 in which data only flows in the direction from the input to the output are sometimes referred to as feed-forward data paths. The use of enabling and disabling bypassable clocked storage elements is well-suited for highly pipelined, latency-insensitive designs that are composed primarily of feed-forward data paths.

Figure 17:
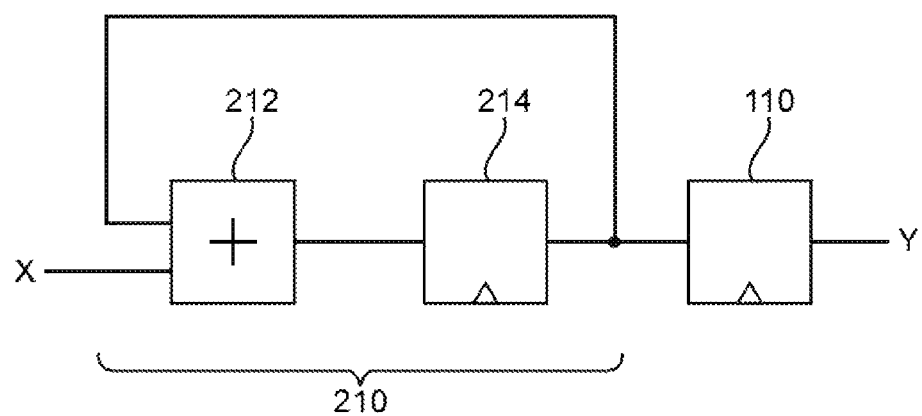
FIG. 17 is a diagram of an illustrative loop circuit with a bypassable clocked storage element coupled to a feed-forward path in accordance with an embodiment of the present invention.

Care has to taken for circuits with feedback paths or "loops" when considering the use of bypassable clocked storage components. FIG. 17 is a diagram showing an exemplary circuit 210 having a loop. Circuit 210 may include an adder circuit 212 and a flip-flop 214. Adder circuit 212 may have a first input that receives a signal from input X, a second input, and an output. Flip-flop 214 may have a data input that is coupled to the output of adder 212 and a data output that is coupled to the second input of adder 212. Connected in this arrangement, circuit 210 may serve as an accumulator circuit. One way of incorporating bypassable clocked storage elements with such types of loop circuits, assuming the design can tolerate increased latencies (and longer startup delay) but not functional changes, is to insert at least one bypassable clocked storage component 110 to the feed-forward output path (e.g., by inserting register 110 between the output of flip-flop 214 and feed-forward output Y.

Alternatively, it may be desirable to minimize the use of loops during synthesis operations (see, FIG. 4 and FIG. 5). Logic design tools 620 may be configured to treat feedback circuits as being more timing critical. As a result, scarce fast resource blocks may be made available only to circuits with loops. Circuits with loops may also be given delay-optimal placement during place and route operations (even if this means an increased total circuit area). Other ways of meeting timing requirements at reduced voltage levels for feedback circuits may include selectively forward body-biasing cells in loops to reduce delay and supplying a fixed nominal (non-reduced) voltage level to such types of circuits.

Another way of handling circuits with loops is to operate feedback circuits in a multithreading scheme. A multithreading architecture involves processing data from different thresholds in alternating cycles without any data dependencies or communications among the different threads.

Figure 18:
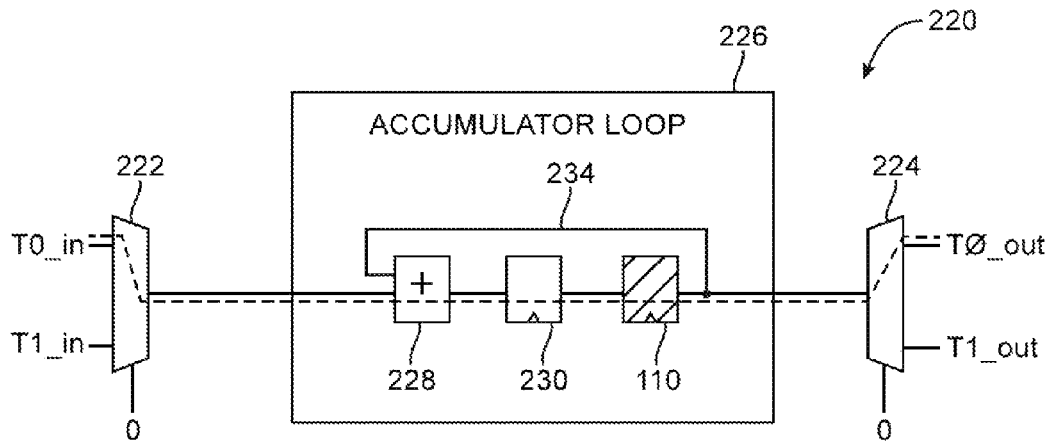
FIG. 18 is a diagram of an illustrative accumulator loop operating in single-thread mode in accordance with an embodiment of the present invention.

FIG. 18 is a diagram of a data path 220 that includes an accumulator loop 226 operating in single thread mode with a minimum latency of one clock cycle. As shown in FIG. 18, accumulator loop 226 may include an adder circuit 228, a flip-flop 230, and a bypassable clocked storage element 110 connected in a loop. In particular, bypassable clocked storage element 110 may be connected before feedback loop 234 without altering the functionality of circuit 226 when data path 220 is operating in multithread mode.

Since data path 220 is operating in single thread mode, element 110 may be bypassed (as indicated by shaded register element 110). An input multiplexer 222 that is coupled to the input of loop 226 may be configured to route only signals from first thread input T0_in through loop 226 to corresponding first thread output T0_out via output multiplexer 224 (e.g., both multiplexers 222 and 224 may receive a low control signal throughout the entirety of single thread operation).

Figure 19:
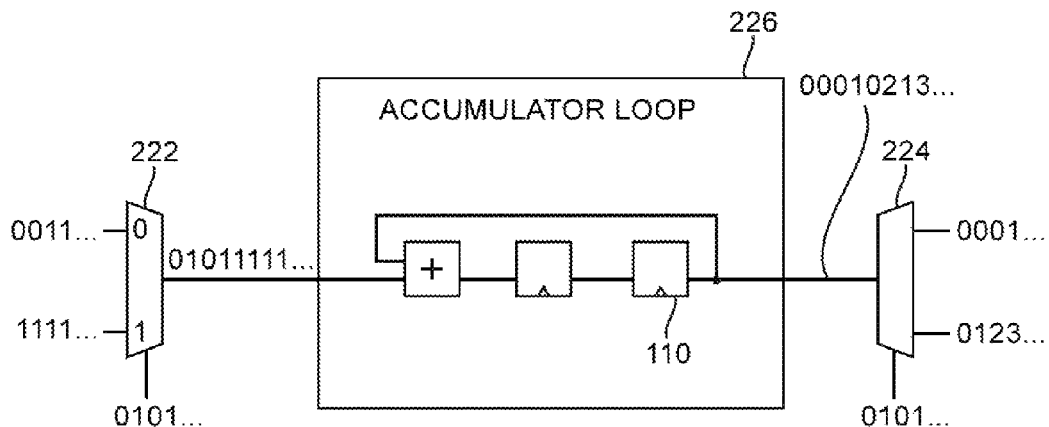
FIG. 19 is a diagram of an illustrative accumulator loop operating in dual-thread mode in accordance with an embodiment of the present invention.

FIG. 19 is a diagram showing data path 220 operating in dual thread mode. In the dual thread mode, bypassable clocked storage element 110 may be enabled and operating voltage can be reduced. In other words, lower voltage operation can be achieved by increasing the number of active threads (e.g., by enabling extra bypassable register components 110 in the loops). As in previous scenarios, enabling clocked storage elements 110 will not affect throughput (assuming frequency is unchanged) but latency will be increases since each thread is only processed once every couple of cycles.

Input multiplexer 222 may continuously toggle between routing input signals from first thread input T0_in and routing input signals from second thread input T1_in to its output. Similarly, multiplexer 224 may continuously toggle between outputting signals to first thread output T0_out and outputting signals to second thread output T1_out. In other words, both multiplexers 222 and 224 may receive an alternating "0101 . . . " control bit pattern throughout the entirely of the dual thread operation to process data from each of the first and second threads.

Figure 20:
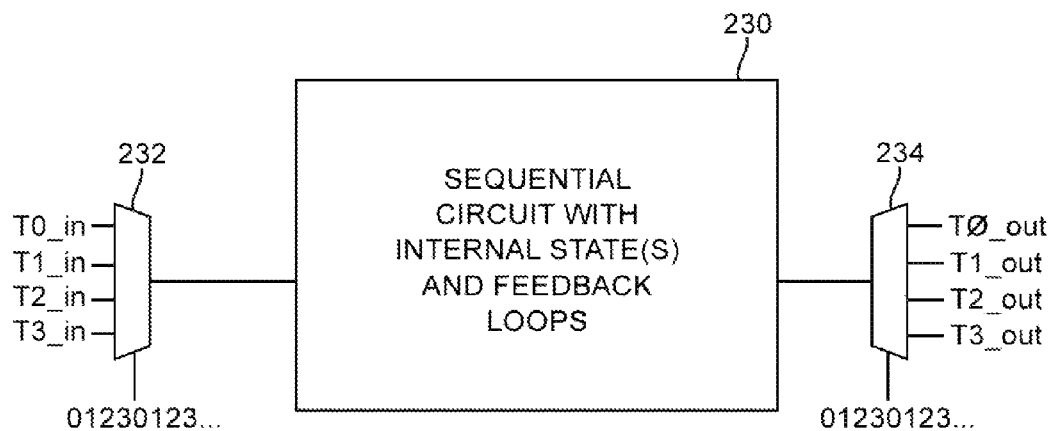
FIG. 20 is a diagram of an illustrative loop circuit operable to operate in a multithread configuration in accordance with an embodiment of the present invention.

FIG. 20 shows a general multithreading configuration that involves alternating among four different threads. In general, multithreading can be applied to any sequential circuit that includes internal states and/or feedback loops. In the example of FIG. 20, quad-thread operation would require at least four bypassable register components in the feedback path. If desired, any suitable number of bypassable clocked storage components can be included in the feedback path to help reduce voltage, increase frequency of operation, or otherwise optimize the performance/power savings of device 10.

Figure 21:
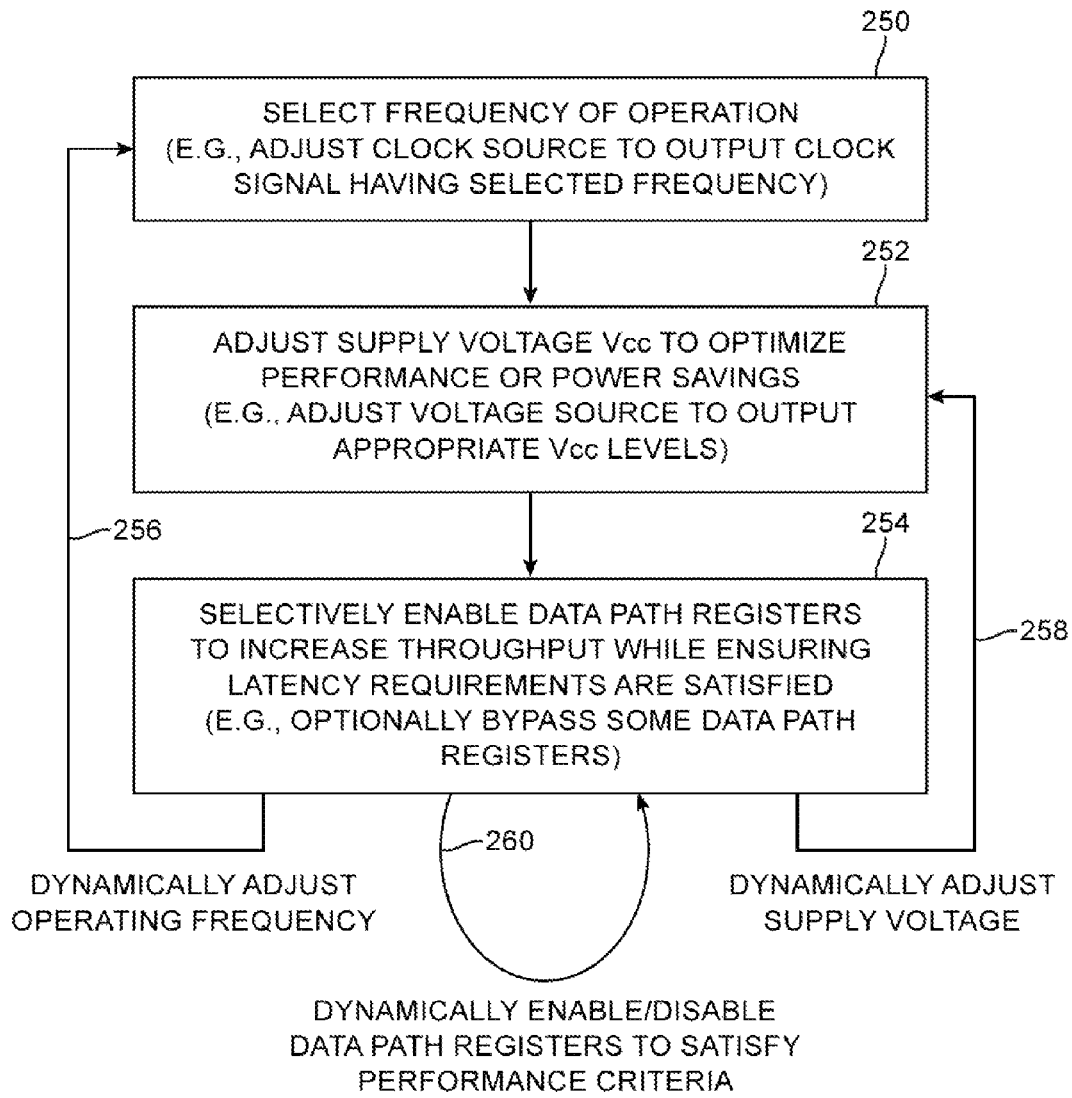
FIG. 21 is a flow chart of illustrative steps for performing dynamic voltage-frequency scaling operations in accordance with an embodiment of the present invention.

FIG. 21 is a flow chart of illustrative steps for performing dynamic voltage-frequency scaling on device 10. At step 250, control circuitry 120 may select a frequency of operation by adjusting a clock generator to output a corresponding clock signal with the selected frequency to the sequential logic circuits on device 10.

At step 252, control circuitry 120 may be used to adjust supply voltage Vcc to optimize for performance savings (e.g., the power supply voltage may be adjusted to desired voltage levels).

At step 254, the bypassable clocked storage elements 110 in the different data paths on device 10 may be selectively enabled to increase throughput while ensuring that latency requirements are satisfied. Processing may loop back to step 250 to dynamically adjust the operating frequency, as indicated by path 256. Processing may also loop back to step 252 to dynamically adjust the power supply voltage, as indicated by path 258. If desired, at least some bypassable registers 110 may be enabled and/or disabled to help ensure that signals traveling along the different data paths have matched latencies and satisfy performance criteria (as indicated by loop 260).

The foregoing is merely illustrative of the principles of this invention and various modifications can be made by those skilled in the art without departing from the scope and spirit of the invention. The foregoing embodiments may be implemented individually or in any combination.

What is claimed is:

1. A method of operating an integrated circuit in at least first and second states, wherein the integrated circuit includes logic circuitry interposed in a data path, the method comprising:

when the integrated circuit is operated in the first state, powering a combinational logic circuit using a first power supply voltage having a first voltage level while operating the logic circuitry at a given frequency, wherein the combinational logic circuit is coupled in series with a bypassable clocked storage element; and when the integrated circuit is operated in the second state, powering the combinational logic circuit using a second power supply voltage having a second voltage level that is different than the first voltage level while operating the logic circuitry at the given frequency, and bypassing the bypassable clocked storage element.

2. The method defined in claim 1, wherein the logic circuitry includes a plurality of bypassable clocked storage elements interposed in the data path, the method further comprising:

switching into use a first subset of the plurality of bypassable clocked storage elements when the integrated circuit is operated in the first state; and switching into use a second subset of the plurality of bypassable clocked storage elements that is different than the first subset when the integrated circuit is operated in the second state.

3. The method defined in claim 1, wherein the logic circuitry further includes a plurality of bypassable clocked storage elements and a plurality of combinational logic delay elements interposed in the data path, the method further comprising:

enabling a first number of bypassable clocked storage elements while the integrated circuit is operated in the first state; and enabling a second number of bypassable clocked storage elements while the integrated circuit is operated in the second state, wherein the second number is greater than the first number, and wherein the second voltage level is less than the first voltage level.

4. The method defined in claim 1, wherein the integrated circuit further includes additional logic circuitry interposed in an additional data path, and wherein the logic circuitry and the additional logic circuitry each include a respective plurality of bypassable register circuits and combinational logic delay elements, the method further comprising:

enabling a portion of the bypassable register circuits in the data path so that the data path exhibits a given data path latency; and enabling a portion of the bypassable register circuits in the additional data path so that the additional data path exhibits the given data path latency, wherein the combinational logic delay elements associated with the data path exhibits delays that are different than delays of the combinational logic delay elements associated with the additional data path.

5. The method defined in claim 1, wherein the logic circuitry includes sequential logic circuits and combinational logic circuits interposed in the data path, the method further comprising:

providing a selected one of the first and second power supply voltages to the combinational logic circuits; and providing a clock signal at the given frequency to the sequential logic circuits.

6. The method defined in claim 1, further comprising:
while powering the combinational logic circuit with the first power supply voltage, operating the logic circuitry at another frequency that is different than the given frequency.

7. The method defined in claim 1, further comprising:
dynamically switching between the first and second states without reconfiguring the integrated circuit with a new set of configuration data.

8. An integrated circuit, comprising:
a data path input;
a data path output;
a plurality of bypassable clocked storage elements interposed in the data path input and the data path output; and
a combinational logic delay element operated at a plurality of voltage levels, wherein the combinational logic delay element is coupled between a given pair of bypassable clocked storage elements in the plurality of bypassable clocked storage elements.

9. The integrated circuit defined in claim 8, further comprising:
a plurality of combinational logic delay elements each of which is coupled between at least one respective pair of adjacent bypassable clocked storage elements in the plurality of bypassable clocked storage elements.

10. The integrated circuit defined in claim 9, further comprising:
control circuitry that provides an adjustable power supply voltage to the plurality of combinational logic delay elements.

11. The integrated circuit defined in claim 9, further comprising:
control circuitry that provides an adjustable clock signal to the plurality of bypassable clocked storage elements.

12. The integrated circuit defined in claim 9, wherein at least one bypassable clocked storage element in the plurality of bypassable clocked storage elements comprises:
an edge-triggered flip-flop circuit having an input and an output; and
a multiplexing circuit having a first input that is coupled to the input of the edge-triggered flip-flop circuit, a second input that is coupled to the output of the edge-triggered flip-flop circuit, and an output, wherein the multiplexing circuit is configured to route signals from its first input to its output when the at least one bypassable clocked storage element is placed in bypass mode, and wherein the multiplexing circuit is configured to route signals from its second input to its output when the at least one bypassable clocked storage element is placed in normal mode.

13. The integrated circuit defined in claim 9, wherein at least one bypassable clocked storage element in the plurality of bypassable clocked storage elements comprises:
first and second inverters connected in a cross-coupled configuration; and
a multiplexing circuit interposed in the pair of cross-coupled inverters, wherein the multiplexing circuit is configured to electrically connect the first and second inverters in the cross-coupled configuration when the at least one bypassable clocked storage element is placed in normal mode, and wherein the multiplexing circuit is configured to break the cross-coupled configuration when the at least one bypassable clocked storage element is placed in bypass mode.

14. The integrated circuit defined in claim 9, further comprising:
control circuitry that provides an adjustable power supply voltage to the plurality of combinational logic delay elements and that provides an adjustable clock signal to the plurality of bypassable clocked storage elements, wherein the control circuitry is adapted to perform dynamic voltage scaling at fixed operating frequencies.

15. A method of operating an integrated circuit, wherein the integrated circuit includes logic circuitry having a feedback loop interposed in a data path, the method comprising:
during a first multithreading mode, processing data from a first number of input threads through the logic circuitry having the feedback loop while the logic circuitry is supplied with a first power supply voltage; and
during a second multithreading mode, processing data from a second number of input threads that is different from the first number of input threads through the logic circuitry having the feedback loop while the logic circuitry is supplied with a second power supply voltage that is different than the first power supply voltage.

16. The method defined in claim 15, wherein the second number of input threads is greater than the first number of input threads, and wherein the second power supply voltage is less than the first power supply voltage.

17. The method defined in claim 16, wherein the logic circuitry further includes a plurality of bypassable clocked storage elements interposed in the data path, further comprising:
enabling a first number of bypassable clocked storage elements in the plurality of bypassable clocked storage elements during the first multithreading mode; and
enabling a second number of bypassable clocked storage elements in the plurality of bypassable clocked storage elements during the second multithreading mode, wherein the second number of bypassable clocked storage elements is greater than the first number of bypassable clocked storage elements.

18. The method defined in claim 16, further comprising:
operating the logic circuitry at a given frequency during the first multithreading mode; and
operating the logic circuitry at the given frequency during the second multithreading mode.

19. The method defined in claim 15, wherein the logic circuitry further includes a plurality of bypassable clocked storage elements interposed in the data path, further comprising:
enabling a first subset of the plurality of bypassable clocked storage elements during the first multithreading mode; and
enabling a second subset of the plurality of bypassable clocked storage elements that is different than the first subset during the second multithreading mode.

20. The method defined in claim 15, wherein the integrated circuit further includes multiplexing circuits interposed in the data path, the method further comprising:
with the multiplexing circuits, routing data from the first number of input threads to the logic circuitry during the first multithreading mode and routing data from the second number of input threads to the logic circuitry during the second multithreading mode, wherein there are no data dependencies among the different input threads.

* * * * *